United States Patent
Lee et al.

(10) Patent No.: US 9,472,622 B2
(45) Date of Patent: Oct. 18, 2016

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventors: Jae-Hoon Lee, Suwon-si (KR); Tae-Geun Kim, Gyeonggi-do (KR); Chan-Ho Park, Gyeonggi-do (KR); Hyun-Jung Her, Gyeonggi-do (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/263,441

(22) Filed: Apr. 28, 2014

(65) Prior Publication Data

US 2015/0021658 A1 Jan. 22, 2015

(30) Foreign Application Priority Data

Jul. 22, 2013 (KR) .................. 10-2013-0086137

(51) Int. Cl.
*H01L 29/66* (2006.01)
*H01L 29/10* (2006.01)
*H01L 29/739* (2006.01)
*H01L 29/40* (2006.01)
*H01L 29/06* (2006.01)

(52) U.S. Cl.
CPC ......... *H01L 29/1095* (2013.01); *H01L 29/402* (2013.01); *H01L 29/7397* (2013.01); *H01L 29/0619* (2013.01); *H01L 29/407* (2013.01)

(58) Field of Classification Search
CPC ........... H01L 29/0696; H01L 29/1095; H01L 29/66325–29/66712; H01L 29/7393–29/7398; H01L 2924/13055; H01L 29/407; H01L 29/7397; H01L 27/0823; H01L 29/40; H01L 29/10; H01L 29/739
See application file for complete search history.

(56) References Cited

U.S. PATENT DOCUMENTS

| | | | |
|---|---|---|---|
| 6,765,239 B2 | 7/2004 | Hiyoshi et al. | |
| 7,923,804 B2 | 4/2011 | Zeng et al. | |
| 2011/0070708 A1* | 3/2011 | Hsieh | 438/270 |
| 2011/0156140 A1 | 6/2011 | Zara | |
| 2012/0037954 A1* | 2/2012 | Hshieh | 257/139 |
| 2012/0043581 A1 | 2/2012 | Koyama et al. | |
| 2012/0061720 A1 | 3/2012 | Parthasarathy et al. | |
| 2013/0037852 A1 | 2/2013 | Tamaki | |
| 2014/0231865 A1* | 8/2014 | Onozawa | 257/139 |

FOREIGN PATENT DOCUMENTS

| | | |
|---|---|---|
| KR | 10-2008-0025368 A | 3/2008 |
| KR | 10-2008-0086479 A | 9/2008 |
| KR | 10-2009-0057976 A | 6/2009 |
| KR | 10-0990502 B1 | 10/2010 |
| KR | 10-2012-0086700 A | 8/2012 |

\* cited by examiner

*Primary Examiner* — Cuong B Nguyen
(74) *Attorney, Agent, or Firm* — Muir Patent Law, PLLC

(57) ABSTRACT

A semiconductor device includes an emitter electrode and a first field plate disposed on one surface of a substrate and spaced apart from each other, a collector electrode disposed on the other surface of the substrate, a trench gate disposed in the substrate, a field diffusion junction disposed in the substrate, and a first contact connecting the trench gate and the first field plate. The first field plate has a first part extending toward the emitter electrode with respect to the first contact and having a first width, and a second part extending toward the field diffusion junction with respect to the first contact and having a second width. The second width is greater than the first width.

8 Claims, 19 Drawing Sheets

SEMICONDUCTOR DEVICE AND METHOD FOR FABRICATING THE SAME

CROSS-REFERENCE TO RELATED APPLICATION

This application claims priority to, and benefit of, Korean Patent Application No. 10-2013-0086137 filed on Jul. 22, 2013 in the Korean Intellectual Property Office, the contents of which in its entirety are herein incorporated by reference.

TECHNICAL FIELD

The present inventive concept relates to a semiconductor device and a method of fabricating the same, and more particularly, to an insulated gate bipolar mode transistor and a method of fabricating the same.

BACKGROUND

High voltage semiconductor devices include an insulated gate bipolar mode transistor (IGBT), a power metal-oxide-semiconductor field effect transistor (MOSFET), a bipolar transistor, and so on.

In particular, the IGBT is a combined switching device of the power MOSFET and the bipolar transistor. The IGBT has low driving power, a high switching speed, a high breakdown voltage and a high current density. The IGBT may include emitters formed on one surface of a substrate and a collector formed on the other surface of the substrate. With this configuration, the IGBT has a channel formed in a vertical direction.

SUMMARY

The present inventive concept provides a semiconductor device, which can improve a breakdown voltage and can reduce the device size.

The present inventive concept also provides a method of fabricating a semiconductor device, which can improve a breakdown voltage and can reduce the device size.

One aspect of the present inventive concept relates to a semiconductor device including an emitter electrode and a first field plate disposed on one surface of a substrate and spaced apart from each other, a collector electrode disposed on the other surface of the substrate, a trench gate disposed in the substrate, a field diffusion junction disposed in the substrate, and a first contact connecting the trench gate and the first field plate, wherein the first field plate has a first part extending toward the emitter electrode with respect to the first contact and having a first width, and a second part extending toward the field diffusion junction with respect to the first contact and having a second width, the second width being greater than the first width.

The semiconductor device may further include a second field plate disposed on the one surface of the substrate, spaced apart from the first field plate and connected to the field diffusion junction.

The field diffusion junction may be free of portions overlapping with the first field plate.

The semiconductor device may further include an interlayer dielectric layer disposed on the one surface of the substrate and having a flat surface. The emitter electrode and the first field plate may be disposed on the interlayer dielectric layer, and the first contact passes through the interlayer dielectric layer.

The substrate may be of a first conductivity type, and the trench gate may include a first gate and a second gate adjacent to each other in a lengthwise direction, and a gate connection part connecting a termination part of the first gate and a termination part of the second gate, and the first contact may be in contact with the gate connection part.

the gate connection part may be directly surrounded by the first conductivity type substrate.

The semiconductor device may further include a junction diffusion region of a second conductivity type, disposed on a lateral surface of the gate connection part disposed toward the field diffusion junction, while not being disposed on a lateral surface of the gate connection part disposed toward the emitter electrode.

The junction diffusion region may entirely overlap with the first field plate.

The junction diffusion region may be disposed on the same level with the field diffusion junction.

The semiconductor device may further include a body of a second conductivity type, disposed between the first gate and the second gate, emitters of the first conductivity type, disposed in the body, a floating well of the second conductivity type, defined at one side of each of the first gate and the second gate while not overlapping with the body, and a second contact connecting the emitters and the emitter electrode.

The first gate may include a first part and a second part that is positioned closer to the gate connection part than the first part, and the second gate includes a first part and a second part corresponding to the first and second parts of the first gate, respectively, and the emitters may be disposed between the first part of the first gate and the first part of the second gate while not being disposed between the second part of the first gate and the second part of the second gate.

The second part of the first gate and the second part of the second gate may overlap with the emitter electrode.

The semiconductor device may further include a dummy emitter of the second conductivity type, disposed in the body disposed between the second part of the first gate and the second part of the second gate.

The floating well may be defined at the same level with the field diffusion region.

The semiconductor device may further include a body of a second conductivity type different from the first conductivity type, disposed around the first gate and the second gate, emitters of the first conductivity type, disposed in the body on lateral surfaces of the first gate and the second gate, and a second contact connecting the emitters and the emitter electrode.

Another aspect of the present inventive concept encompasses a semiconductor device including a substrate of a first conductivity type, the substrate having a first region and a second region defined therein, first and second trench gates disposed in the first region and positioned to be adjacent to each other in a lengthwise direction, a body disposed between the first trench gate and the second trench gate and having a second conductivity type different from the first conductivity type, emitters of the first conductivity type, disposed in the body, a floating well of the second conductivity type, defined at one side of each of the first trench gate and the second trench gate while not overlapping with the body, an emitter electrode disposed on the substrate to be connected to the emitter, a gate connection part disposed in the first region and connecting termination parts of the first and second trench gates, a field diffusion junction disposed in the second region, a first contact in contact with the gate connection part in the first region, and a first field plate having a first part and a second part and connected to the first contact on the first contact, the first part extending toward the emitter electrode with respect to the first contact and having a first width, and the second part extending toward the field diffusion junction with respect to the first contact and having a second width that is greater than the first width.

The semiconductor device may further include an interlayer dielectric layer disposed on the substrate and having a flat surface while covering the first trench gate, the second trench gate and the gate connection part, and the first contact passes through the interlayer dielectric layer and the emitter electrode and the first field plate are disposed on the interlayer dielectric layer.

The field diffusion junction may be free of portions overlapping with the first field plate.

The semiconductor device may further include a second field plate spaced apart from the first field plate and connected to the field diffusion junction.

The gate connection part may be directly surrounded by the first conductivity type substrate.

The semiconductor device may further include a junction diffusion region of the second conductivity type, disposed on a lateral surface of the gate connection part disposed toward the field diffusion junction, while not being disposed on a lateral surface of the gate connection part disposed toward the emitter electrode.

The semiconductor device may further include a second contact connecting the emitter electrode and the emitters, and the first contact and the second contact are disposed at the same height and include the same material as each other.

The first trench gate may include a first part and a second part that is positioned closer to the gate connection part than the first part, and the second trench gate may include a first part and a second part corresponding to the first and second parts of the first trench gate, respectively, and the emitters may be disposed between the first part of the first trench gate and the first part of the second trench gate while not being disposed between the second part of the first trench gate and the second part of the second trench gate.

The second part of the first trench gate and the second part of the second trench gate may overlap with the emitter electrode.

The semiconductor device may further include a dummy emitter of second conductivity type, disposed in the body disposed between the second part of the first trench gate and the second part of the second trench gate.

Still another aspect of the present inventive concept relates to a semiconductor device, including an emitter electrode and a first field plate disposed on one surface of a substrate and spaced apart from each other, a collector electrode disposed on the other surface of the substrate, a trench gate disposed in the substrate and including a first gate and a second gate adjacent to each other in a lengthwise direction, a first contact connecting the trench gate and the first field plate, and a junction diffusion region of a second conductivity type. The trench gate includes a gate connection part connecting a termination part of the first gate and a termination part of the second gate. The junction diffusion region is disposed on a lateral surface of the gate connection part disposed toward the field diffusion junction.

The semiconductor device may include a field diffusion junction disposed in the substrate. The first field plate may have a first part extending toward the emitter electrode with respect to the first contact and having a first width, and a second part extending toward the field diffusion junction with respect to the first contact and having a second width that is greater than the first width.

The semiconductor device may include a second field plate disposed on the one surface of the substrate, spaced apart from the first field plate and connected to the field diffusion junction.

The field diffusion junction may not overlap with the first field plate.

The semiconductor device may include an interlayer dielectric layer disposed on the one surface of the substrate and having a flat surface. The emitter electrode and the first field plate may be disposed on the interlayer dielectric layer. The first contact may pass through the interlayer dielectric layer.

The substrate may be of a first conductivity type. The first contact may be in contact with the gate connection part.

The gate connection part may be directly surrounded by the first conductivity type substrate.

The junction diffusion region may entirely overlap with the first field plate.

The junction diffusion region may be disposed on the same level as a level of the field diffusion junction.

The junction diffusion region may not be disposed on a lateral surface of the gate connection part disposed toward the emitter electrode

BRIEF DESCRIPTION OF THE DRAWINGS

The above and other features and advantages of the present inventive concept will become more apparent by describing in detail preferred embodiments thereof with reference to the attached drawings in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Figure 1:
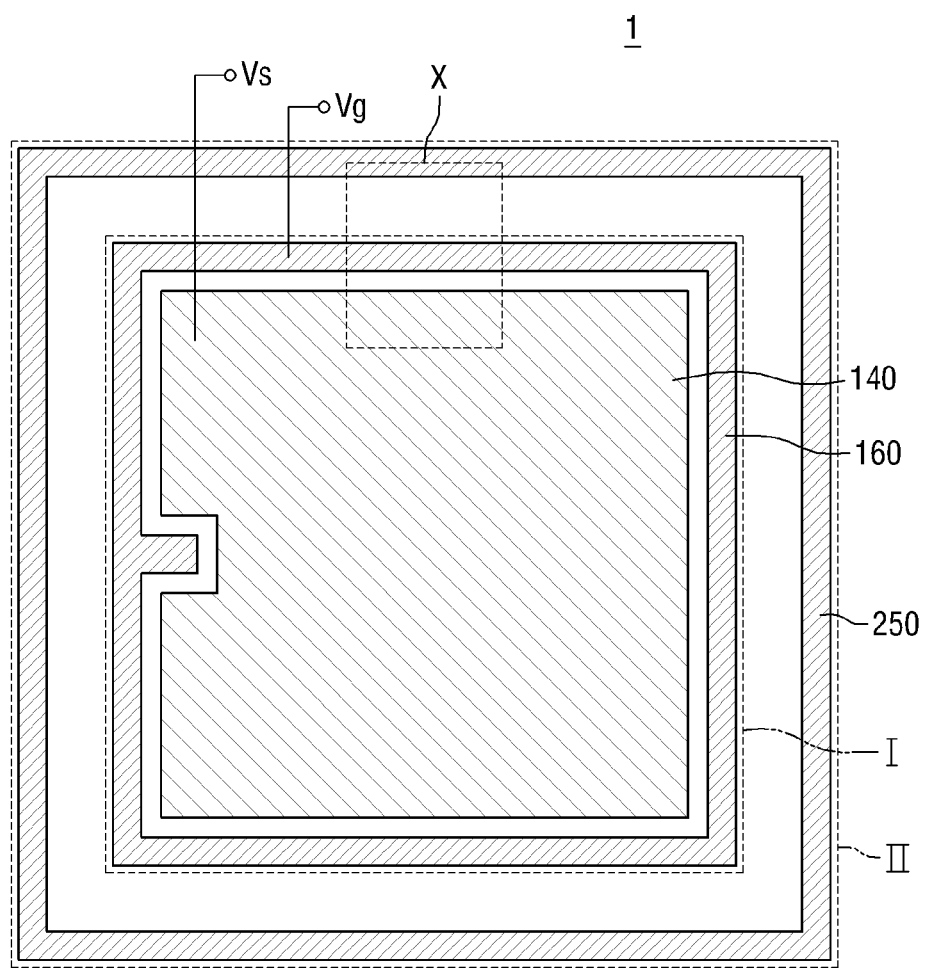
FIG. 1 is a plan view of a semiconductor device according to a first embodiment of the present inventive concept.

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. When an element is referred to as being "directly connected to" or "directly coupled to" another element or layer, it is possible that there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. When an element is referred to as being "directly on" another element, it is possible that there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Hereinafter, a semiconductor device according to a first embodiment of the present inventive concept will be described with reference to FIGS. 1 to 3.

Figure 2:
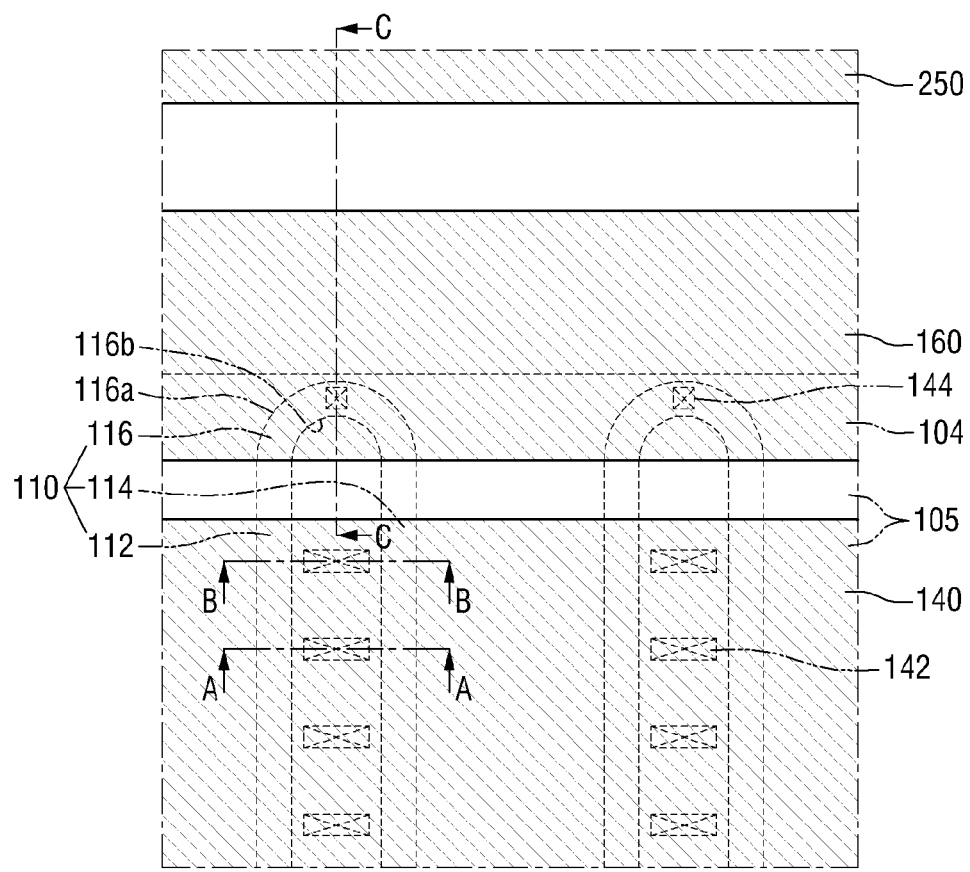
FIG. 2 is a partial plan view of the semiconductor device according to the first embodiment of the present inventive concept.
Figure 3:
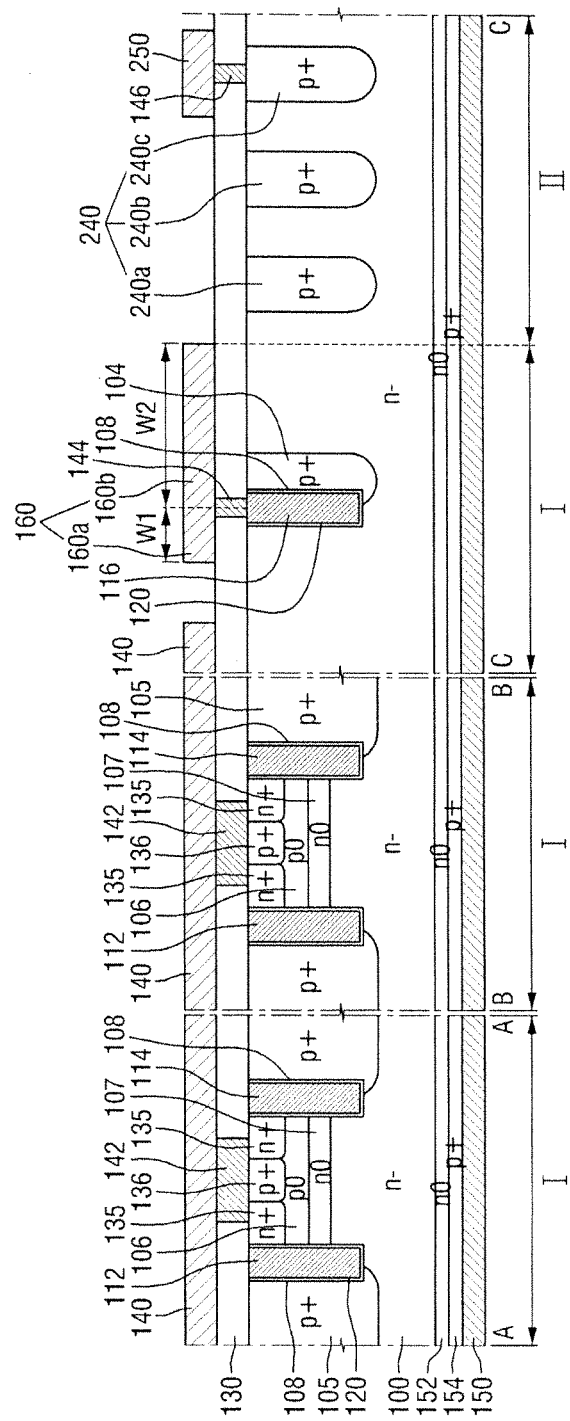
FIG. 3 is a cross-sectional view taken along lines A-A, B-B and C-C of FIG. 2.

FIG. 1 is a plan view of a semiconductor device according to a first embodiment of the present inventive concept, FIG. 2 is a partial plan view of the semiconductor device according to the first embodiment of the present inventive concept and FIG. 3 is a cross-sectional view taken along lines A-A, B-B and C-C of FIG. 2.

First, referring to FIG. 1, the semiconductor device 1 according to the first embodiment of the present inventive concept may have a first region I and a second region II. The first region I is a device forming region, where a floating well (105 of FIG. 3), emitters (135 of FIG. 3), or the like may be formed. The second region II is a termination part, where a termination ring (i.e., a field diffusion junction 240 of FIG. 3) for field diffusion, a second field plate 250, or the like may be disposed. An emitter electrode 140 may be connected to the emitters (135 of FIG. 3) of a high voltage semiconductor device and may be shaped of a plate. As shown in FIG. 1, a first field plate 160 for applying the same voltage to a trench gate structure (110 of FIG. 2) may be shaped to surround the emitter electrode 140.

Referring to FIGS. 2 and 3, the semiconductor device 1 according to the first embodiment of the present inventive concept may include a trench gate structure 110, the field diffusion junction 240, a second contact 144, an emitter electrode 140, a first field plate 160, and a collector electrode 150.

A substrate 100 may include a base substrate and an epitaxial layer grown on the base substrate, but the present inventive concept is not limited thereto. The substrate 100 may include only a base substrate without an epitaxial layer. The substrate 100 may be a silicon substrate, a gallium arsenide substrate, a silicon germanium substrate, a ceramic substrate, a quartz substrate, or a glass substrate for display. Alternatively, the substrate 100 may be a semiconductor on insulator (SOI). In the following description, a silicon substrate is exemplified. In addition, the substrate 100 may have, for example, a first conductivity type (e.g., N type).

A trench gate structure 110 may be formed in the first region I of the substrate 100. As shown, the trench gate structure 110 may include a first trench gate 112 and a second trench gate 114 adjacent to each other in a lengthwise direction, and a gate connection part 116 connecting a termination part of the first trench gate 112 and a termination part of the second trench gate 114. For example, the gate connection part 116 may refer to a part of the trench gate structure 110 overlapping with the first field plate 160. Each of the first trench gate 112 and the second trench gate 114 may include a part overlapping with the emitter electrode 140 and a part not overlapping with the emitter electrode 140 and the first field plate 160.

Referring to FIG. 3, a trench 108 may be formed in the substrate 100, and a gate insulation layer 120 may be conformally formed along lateral surfaces and bottom surface of the trench 108. The first trench gate 112, the second trench gate 114 and the gate connection part 116 may be formed on the gate insulation layer 120 in the trench 108. In the embodiment illustrated in FIGS. 2 and 3, the trench gate structure 110, e.g., the first and second trench gates 112 and 114 and the gate connection part 116, may entirely fill the trench 108, but the present inventive concept is not limited thereto. The trench gate structure 110 may partially fill the trench 108.

The trench gate structure 110 may include, for example, polysilicon, but not limited thereto. The first trench gate 112, the second trench gate 114 and the gate connection part 116 may be concurrently formed. The gate insulation layer 120 may include at least one of silicon oxide, silicon nitride, silicon oxynitride and a high-k (dielectric) material. The high-k material may include, but not limited to, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Alternatively, the trench 108 may have a cross section having various shapes. The cross section of the trench 108 may be tapered toward the inside of the substrate 100, may be rectangular or may be rounded at its lateral surface and bottom surface.

A body 106, emitters 135, a barrier layer 107, a floating well 105, etc. may be formed in the substrate 100 around the first trench gate 112 and the second trench gate 114.

In the first region I, the body 106 may be formed between the first trench gate 112 and the second trench gate 114 adjacent to each other. In detail, the body 106 may be formed between the lateral surfaces of the first trench gate 112 and the second trench gate 114 facing each other. The body 106 may have a second conductivity type (e.g., P type) different from the first conductivity type of the substrate 100. The body 106 may not extend up to the gate connection part 116.

The emitters 135 may be formed in the body 106 and may have the first conductivity type (e.g., N type), which is the same as that of the substrate 100. At least portions of the emitters 135 may overlap with the lateral surfaces of the first and second trench gates 112 and 114. A doping region 136 of second conductivity type (e.g., P type) may be formed between the emitters 135.

The floating well 105 may be formed at one side of each of the first trench gate 112 and the second trench gate 114 and may have the second conductivity type (e.g., P type). In addition, the floating well 105 may be formed so as not to overlap with the body 106. Therefore, the floating well 105 may not be formed on the facing lateral surfaces of the first trench gate 112 and the second trench gate 114. The floating well 105 may improve conduction modulation. The conduction modulation refers to a phenomenon that when the number of minor carriers (i.e., holes) increases at a region where major carriers (i.e., electrons) are present in a low concentration, the number of major carriers increases in proportion to the number of minor carriers and electrical resistance decreases accordingly.

In the semiconductor device 1 according to the first embodiment of the present inventive concept, a dopant of first conductivity type (e.g., N type) may be doped into the substrate 100 (i.e., a drift region) in a small concentration. Therefore, if holes increase in the drift region, the number of electrons may increase in the drift region in proportion to the number of increased holes. Accordingly, the current may flow from a collector 154 to the emitters 135.

The barrier layer 107 may be formed between the first trench gate 112 and the second trench gate 114 and have the first conductivity type (e.g., N type). The barrier layer 107 may be formed under the body 106. The barrier layer 107 may function as a potential barrier for holes induced into the substrate 100 (i.e., the drift region). The barrier layer 107 may accumulate more holes in the drift region and improve conduction modulation. The barrier layer 107 may have the same conductivity type as the drift region, that is, the first conductivity type (e.g., N type). The barrier layer 107 may have a higher doping concentration than the drift region. In addition, the barrier layer 107 may have a lower doping concentration than the floating well 105.

In the semiconductor device 1 according to the first embodiment of the present inventive concept, the body 106 may be formed to be shallower than the first trench gate 112 and the second trench gate 114. In addition, the floating well 105 may be formed to be deeper than the body 106. Further, the floating well 105 may be formed to be more deeply than the first trench gate 112 and the second trench gate 114 or may be formed of the same depth as the first trench gate 112 and the second trench gate 114. Therefore, one-side surfaces of the first trench gate 112 and the second trench gate 114 may be entirely surrounded by the floating well 105.

A field diffusion junction 240 may be formed in the second region II of the substrate 100. The field diffusion junction 240 may have second conductivity type (e.g., P type). The field diffusion junction 240 may diffuse an electrical field formed in the first region I. Three field diffusion junctions 240a, 240b and 240c formed in the second region II are exemplified in FIG. 3, but the present inventive concept is not limited thereto.

In the first region I, a junction diffusion region 104 may be formed only on one lateral surface of the gate connection part 116 (e.g., a right lateral surface thereof in FIG. 3) and not be formed on other lateral surfaces of the gate connection part 116 (e.g., a left lateral surface thereof in FIG. 3). The gate connection part 116 may include a lateral surface 116a (see FIG. 2) facing the second field plate 250, that is, a lateral surface 116a being disposed toward the field diffusion junction 240, and a lateral surface 116b facing the emitter electrode 140.

In the semiconductor device 1 according to the first embodiment of the present inventive concept, the junction diffusion region 104 may be formed on the lateral surface 116a of the gate connection part 116 facing the second field plate 250 (that is, the lateral surface 116a being disposed toward the field diffusion junction 240) while not being formed on the lateral surface 116b of the gate connection part 116 facing the emitter electrode 140. That is, one lateral surface of the gate connection part 116 may be directly surrounded by the junction diffusion region 104 of second conductivity type (e.g., P type), and the other lateral surface of the gate connection part 116 may be directly surrounded by the substrate 100 of first conductivity type (e.g., N type). Here, what is meant by the expression "being directly surrounded by the substrate of first conductivity type" is that the lateral surface of the gate connection part 116 directly surrounded by the substrate 100 of first conductivity type includes only the substrate 100 of first conductivity type (e.g., N type) but does not include a doping region of second conductivity type (e.g., P type) (e.g., a junction diffusion region). Therefore, the one lateral surface 116a of the gate connection part 116 may include only a surface of second conductivity type (e.g., P type), and the other lateral surface 116b of the gate connection part 116 may include only a surface of first conductivity type (e.g., N type).

In the semiconductor device 1 according to the first embodiment of the present inventive concept, the floating well 105, the field diffusion junction 240, and the junction diffusion region 104 may be formed on the same level or at the same depth. Here, such two elements on the "the same level" may be formed by the same fabrication process. The floating well 105, the field diffusion junction 240, and the junction diffusion region 104 may be formed in the substrate 100 at substantially the same depth.

In addition, in the semiconductor device 1 according to the first embodiment of the present inventive concept, the floating well 105 and the junction diffusion region 104 may be connected to each other.

The junction diffusion region 104 may be formed on one of both lateral surfaces of the gate connection part 116, thereby more effectively diffusing an electrical field generated in the semiconductor device 1. That is, the junction diffusion region 104 and the first field plate 160 may be simultaneously formed, thereby more effectively suppressing the electrical field from concentrating on the gate connection part 116.

An interlayer dielectric layer 130 may be formed on one surface of the substrate 100. In detail, the interlayer dielectric layer 130 may cover all of the first trench gate 112, the second trench gate 114, the gate connection part 116 and the field diffusion junction 240. The interlayer dielectric layer 130 may have a planarized surface. The interlayer dielectric layer 130 may include silicon oxide, but the present inventive concept is not limited thereto.

Referring to FIG. 3, first and second contacts 142 and 144 may be formed in the first region I, and a third contact 146 may be formed in the second region II. The first contact 142 may pass through the interlayer dielectric layer 130 to then be brought into contact with the emitters 135. In a case where the doping region 136 of second conductivity type (e.g., P type) is formed between the emitters 135, the first contact 142 may make contact with both of the emitters 135 and the doping region 136 of second conductivity type (e.g., P type). The second contact 144 may pass through the interlayer dielectric layer 130 to then be brought into contact with the gate connection part 116. The third contact 146 may pass through the interlayer dielectric layer 130 to then be brought into contact with one (e.g., the field diffusion junction 240*c*) among the field diffusion junctions 240*a*, 240*b* and 240*c*. The field diffusion junction 240*c* making contact with the third contact 146 may be a field diffusion junction that is farthest from the gate connection part 116, but the present inventive concept is not limited thereto. In the embodiment illustrated in FIG. 3, only one field diffusion junction 240*c* among three field diffusion junctions 240*a*, 240*b* and 240*c* may make contact with the third contact 146, but the present inventive concept is not limited thereto.

Since the first to third contacts 142, 144 and 146 pass through the interlayer dielectric layer 130 having a planarized surface, they may have the same height. In addition, the first to third contacts 142, 144 and 146 may include the same material. The first to third contacts 142, 144 and 146 may include, for example, at least one of aluminum, copper, tungsten and titanium, but the present inventive concept is not limited thereto.

The emitter electrode 140, the first field plate 160 and the second field plate 250 may be formed on one surface of the substrate 100 having the interlayer dielectric layer 130. In other words, the emitter electrode 140, the first field plate 160 and the second field plate 250 may be formed on the interlayer dielectric layer 130. The emitter electrode 140 and the first field plate 160 may be formed in the first region I of the substrate 100 to be spaced apart from each other. The second field plate 250 may be formed in the second region II of the substrate 100 to be spaced apart from first field plate 160.

The emitter electrode 140 may be connected to the emitters 135 through the first contact 142, the first field plate 160 may be connected to the gate connection part 116 through the second contact 144, and the second field plate 250 may be connected to the field diffusion junction 240 through the third contact 146.

The emitter electrode 140, electrically connected to the emitters 135 by the first contact 142, may supply an emitter voltage Vs to the emitters 135. The first field plate 160, electrically connected to the gate connection part 116 by the second contact 144, may supply a gate voltage Vg to the trench gate structure 110. The first field plate 160 may function as a field plate while supplying the gate voltage Vg to the trench gate structure 110. The second field plate 250 may float.

Since the emitter electrode 140, the first field plate 160 and the second field plate 250 are formed on the planarized interlayer dielectric layer 130, they may have the same thickness. In addition, the emitter electrode 140, the first field plate 160 and the second field plate 250 may include the same material. In detail, the emitter electrode 140, the first field plate 160 and the second field plate 250 may include, for example, at least one of aluminum, copper, tungsten and titanium, but the present inventive concept is not limited thereto.

In addition, the first to third contacts 142, 144 and 146, the emitter electrode 140, the first field plate 160 and the second field plate 250 may include the same material, but the present inventive concept is not limited thereto.

The first field plate 160 may have a first part 160*a* extending toward the emitter electrode 140 with respect to the second contact 144, and a second part 160*b* extending toward the field diffusion junction 240 with respect to the second contact 144. A width of the first part 160*a* of the first field plate 160 may be a first width w1 and a width of the second part 160*b* of the first field plate 160 may be a second width w2. In the semiconductor device 1 according to the first embodiment of the present inventive concept, the first width w1 of the first part 160*a* of the first field plate 160 may be smaller than the second width w2 of the second part 160*b* of the first field plate 160. For example, the second width w2 of the second part 160*b* of the first field plate 160 extending toward the field diffusion junction 240 with respect to the second contact 144 may be in a range of between 30 μm and 100 μm. As the second width w2 of the second part 160*b* of the first field plate 160 increases from 30 μm to 100 μm, the breakdown voltage may increase from 1340 V to 1430 V. In more detail, when the second width w2 of the second part 160*b* of the first field plate 160 is greater than or equal to 50 μm, the breakdown voltage of the semiconductor device 1 may be 1400 V or higher.

The first field plate 160 having an asymmetric width with respect to the second contact 144 may not overlap with the field diffusion junction 240 formed in the second region II. Therefore, a distance between the gate connection part 116 and the field diffusion junction 240*a* that is closest to the gate connection part 116 may be greater than the second width w2 of the second part 160*b* of the first field plate 160.

In addition, the junction diffusion region 104 formed on one of the lateral surfaces of the gate connection part 116, facing the field diffusion junction 240, may entirely overlap with the first field plate 160. In detail, the junction diffusion region 104 may entirely overlap with the second part 160*b* of the first field plate 160. The junction diffusion region 104 may be simultaneously formed with the first field plate 160, thereby more effectively suppressing the electrical field from concentrating on the gate connection part 116. However, since the junction diffusion region 104 entirely overlaps with the first field plate 160, an increase in the size of the semiconductor device 1 by the junction diffusion region 104 may be negligible.

The collector 154 may be formed not only on one surface of the substrate 100 entirely covered by the interlayer dielectric layer 130 but also on the other surface of the substrate 100 facing the one surface of the substrate 100. The collector 154 may have second conductivity type (e.g., P type).

The collector electrode 150, formed on the other surface of the substrate 100, may make contact with the collector 154. The collector electrode 150 may include, for example, at least one of aluminum, copper, tungsten, titanium, nickel, nickel vanadium, silver and gold, but the present inventive concept is not limited thereto. The collector electrode 150 may include the same material as the emitter electrode 140 or a different material from the emitter electrode 140.

A buffer layer 152 may be formed on the other surface of the substrate 100 so as to make contact with the collector 154, but the present inventive concept is not limited thereto. The buffer layer 152 may prevent a punch-through phenomenon, thereby improving a breakdown voltage characteristic. That is, the buffer layer 152 may function as a field stop layer. The buffer layer 152 may have the same conductivity type as the substrate 100 (e.g., drift region), that is, the first conductivity type (e.g., N type). The buffer layer 152 may have a higher doping concentration than the drift region and a lower doping concentration than the emitters 135.

A semiconductor device 2 according to a second embodiment of the present inventive concept will now be described with reference to FIGS. 1, 4 and 5. The following descriptions will focus on differences from the previous embodiment shown in FIGS. 1 to 3.

Figure 4:
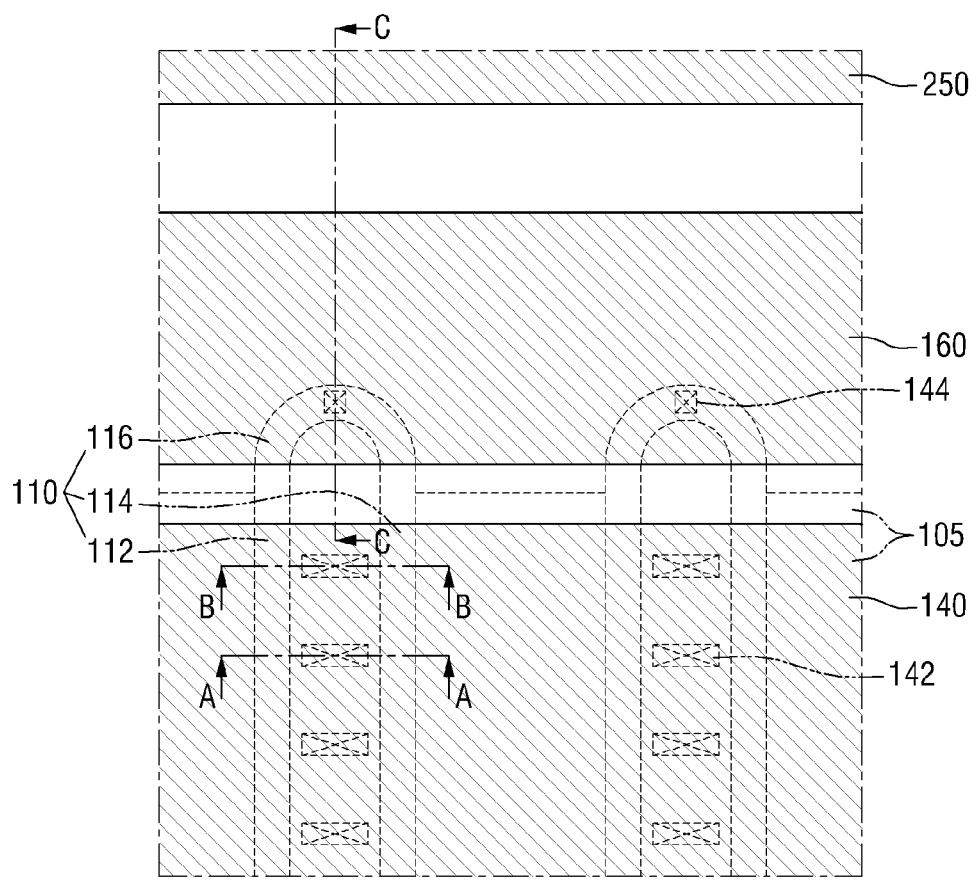
FIG. 4 is a partial plan view of the semiconductor device according to a second embodiment of the present inventive concept.

FIG. 4 is a partial plan view of a semiconductor device according to a second embodiment of the present inventive concept, illustrating a partially enlarged plan view of a portion X of FIG. 1. FIG. 5 is a cross-sectional view taken along lines A-A, B-B and C-C of FIG. 4.

Figure 5:
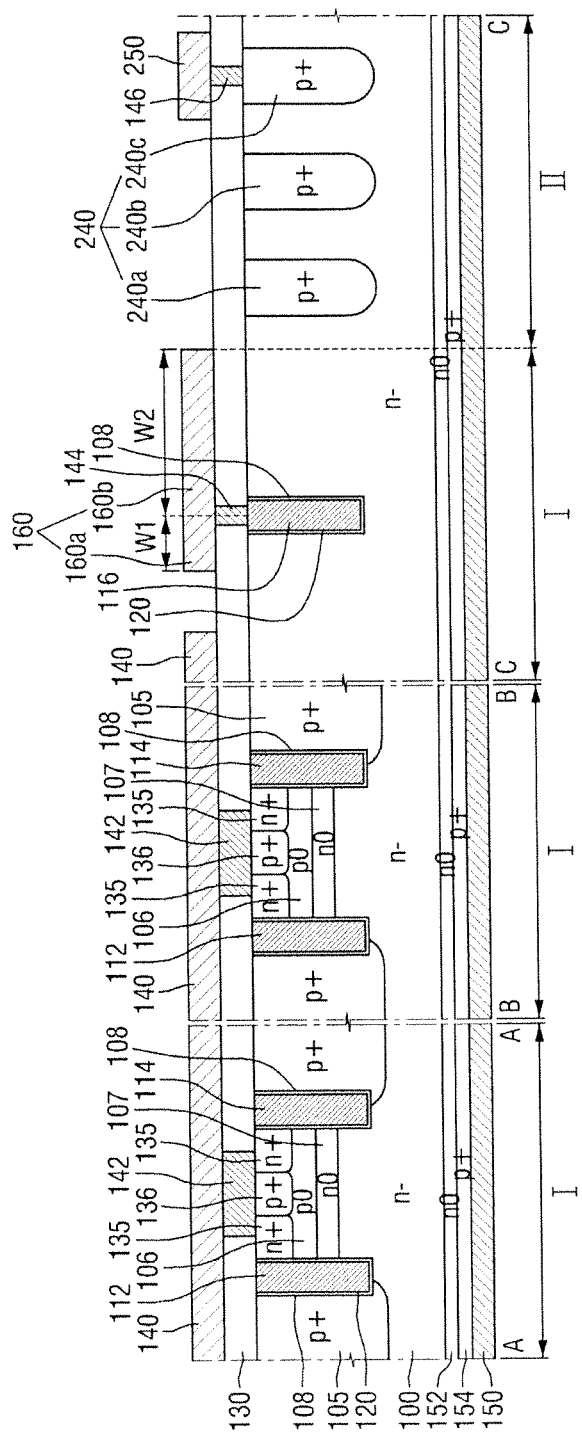
FIG. 5 is a cross-sectional view taken along lines A-A, B-B and C-C of FIG. 4.

Referring to FIGS. 4 and 5, the semiconductor device 2 according to the second embodiment of the present inventive concept may not include a junction diffusion region 104. In a case where a sufficiently high breakdown voltage characteristic can be obtained using only the first field plate 160 without the junction diffusion region 104, the junction diffusion region 104 may not be formed.

The gate connection part 116 may be directly surrounded by the substrate 100 of the first conductivity type. A portion of the substrate 100 directly surrounding the gate connection part 116 may not have the second conductivity type (e.g., P type) but may have only the first conductivity type (e.g., N type). That is, both lateral surfaces of the gate connection part 116 may have only the first conductivity type.

In the second embodiment as illustrated in FIG. 4, the boundary of a floating well 105 may be positioned in the middle of regions of the floating well 105 not overlapping with the emitter electrode 140 and the first field plate 160, but the present inventive concept is not limited thereto.

A semiconductor device 3 according to a third embodiment of the present inventive concept will now be described with reference to FIGS. 1, 6 and 7. The following descriptions will focus on differences from the previous embodiment shown in FIGS. 1 to 3.

Figure 6:
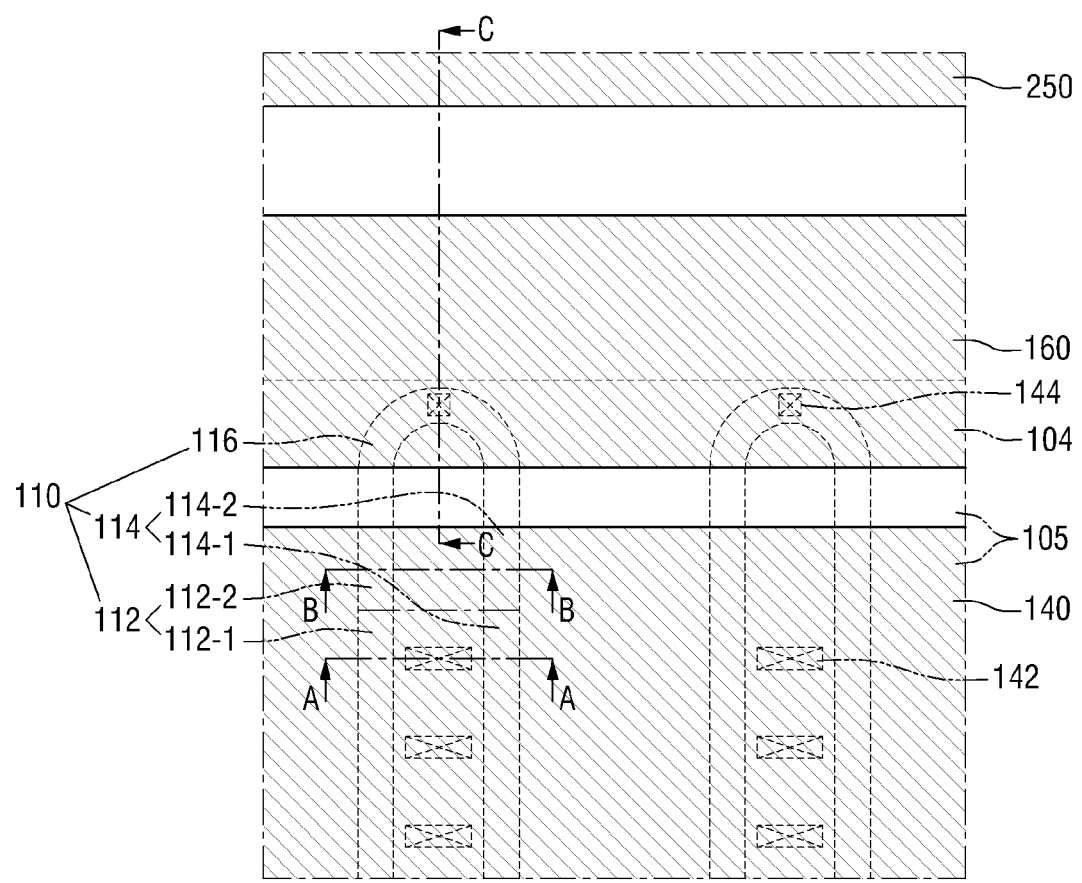
FIG. 6 is a partial plan view of the semiconductor device according to a third embodiment of the present inventive concept.

FIG. 6 is a partial plan view of a semiconductor device according to the third embodiment of the present inventive concept, illustrating a partially enlarged plan view of a portion X of FIG. 1. FIG. 7 is a cross-sectional view taken along lines A-A, B-B and C-C of FIG. 6.

Figure 7:
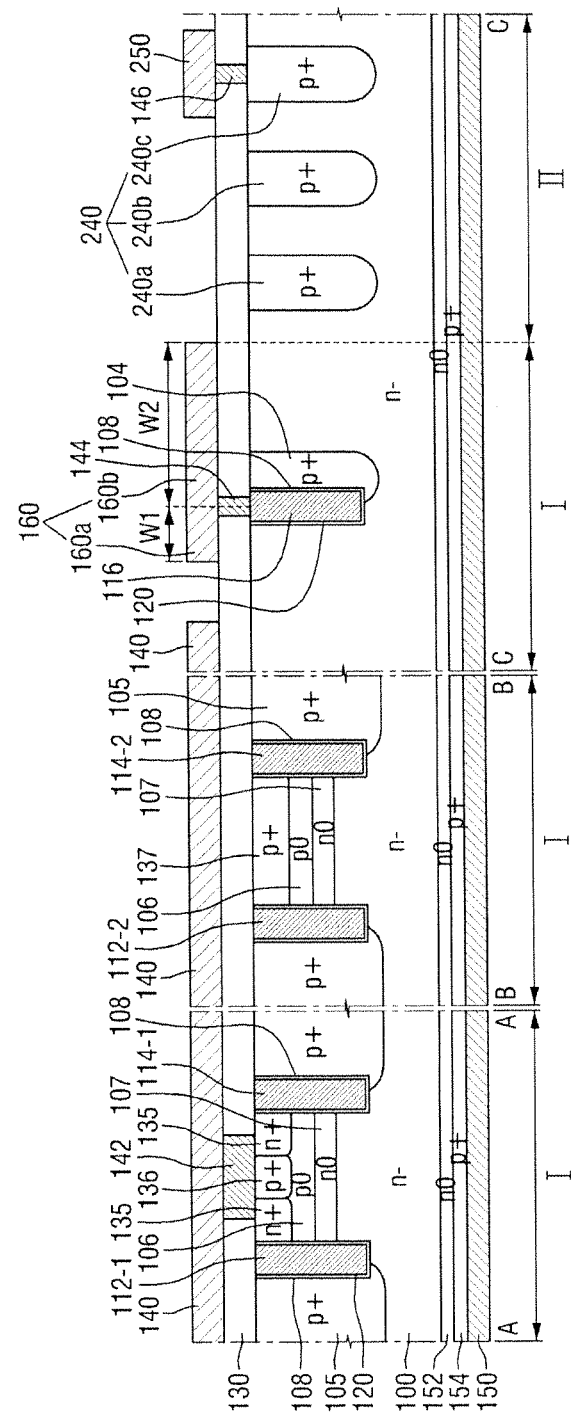
FIG. 7 is a cross-sectional view taken along lines A-A, B-B and C-C of FIG. 6.

Referring to FIGS. 6 and 7, the semiconductor device 3 according to the third embodiment of the present inventive concept may include a dummy emitter 137 that is not electrically connected to an emitter electrode 140.

A first trench gate 112 may include a first part 112-1 and a second part 112-2. In addition, a second trench gate 114 may include a first part 114-1 and a second part 114-2. The first part 112-1 of the first trench gate 112 and the first part 114-1 of the second trench gate 114 may be disposed corresponding to each other, and the second part 112-2 of the first trench gate 112 and the second part 114-2 of the second trench gate 114 may be disposed corresponding to each other. That is, the first part 112-1 of the first trench gate 112 and the second part 112-2 of the first trench gate 112 may face the first part 114-1 of the second trench gate 114 and the second part 114-2 of the second trench gate 114, respectively. In addition, the second part 112-2 of the first trench gate 112 may be closer to the gate connection part 116 than the first part 112-1 of the first trench gate 112, and the second part 114-2 of the second trench gate 114 may be closer to the gate connection part 116 than the first part 114-1 of the second trench gate 114. The second part 112-2 of the first trench gate 112 and the second part 114-2 of the second trench gate 114 may overlap with the emitter electrode 140.

A body 106 may be formed between the first part 112-1 of the first trench gate 112 and the first part 114-1 of the second trench gate 114 and between the second part 112-2 of the first trench gate 112 and the second part 114-2 of the second trench gate 114, where a floating well 105 is not formed. In addition, a barrier layer 107 may further be formed under the body 106.

Emitters 135 of the first conductivity type (e.g., N type) may be formed in the body 106 between the first part 112-1 of the first trench gate 112 and the first part 114-1 of the second trench gate 114. However, the emitters 135 of the first conductivity type (e.g., N type) may not be formed in the body 106 between the second part 112-2 of the first trench gate 112 and the second part 114-2 of the second trench gate 114

A dummy emitter 137 of the second conductivity type (e.g., P type) may be formed between the second part 112-2 of the first trench gate 112 and the second part 114-2 of the second trench gate 114, where the emitters 135 of first conductivity type (e.g., N type) are not formed. The dummy emitter 137 of second conductivity type (e.g., P type) may be formed in the body 106 between the second part 112-2 of the first trench gate 112 and the second part 114-2 of the second trench gate 114. While the body 106 and the dummy emitter 137 are formed to have the same conductivity type, that is, the second conductivity type (e.g., P type), they may be formed in different concentrations. In detail, the body 106 may be formed in a first concentration, and the dummy emitter 137 may be formed in a second concentration higher than the first concentration.

A doping region 136 of second conductivity type (e.g., P type) may be formed between the emitters 135 that are formed between the first part 112-1 of the first trench gate 112 and the first part 114-1 of the second trench gate 114. In the semiconductor device 3 according to the third embodiment of the present inventive concept, the doping region 136 of second conductivity type and the dummy emitter 137 of second conductivity type 137 may be formed on the same level, but the present inventive concept is not limited thereto. The doping region 136 of second conductivity type and the dummy emitter of second conductivity type 137 may be formed by separate processes.

The emitters 135 formed between the first part 112-1 of the first trench gate 112 and the first part 114-1 of the second trench gate 114 may make contact with the first contact 142 passing through an interlayer dielectric layer 130. However, the first contact 142 may not be formed on the dummy emitter 137 formed between the second part 112-2 of the first trench gate 112 and the second part 114-2 of the second trench gate 114. That is, the dummy emitter 137 formed between the second part 112-2 of the first trench gate 112 and the second part 114-2 of the second trench gate 114 may not be electrically connected to the emitter electrode 140. Therefore, the dummy emitter 137 may not function as a high-voltage semiconductor device.

Although the dummy emitter 137 does not function as a high-voltage semiconductor device, the dummy emitter 137 may diffuse an electrical field formed in the first region I. That is, the dummy emitter 137 may function as another junction diffusion region or field diffusion junction, thereby improving a breakdown voltage of the semiconductor device 3.

A semiconductor device 4 according to a fourth embodiment of the present inventive concept will now be described with reference to FIGS. 1, 8 and 9. The following description will focus on differences from the previous embodiment shown in FIGS. 1 to 3.

Figure 8:
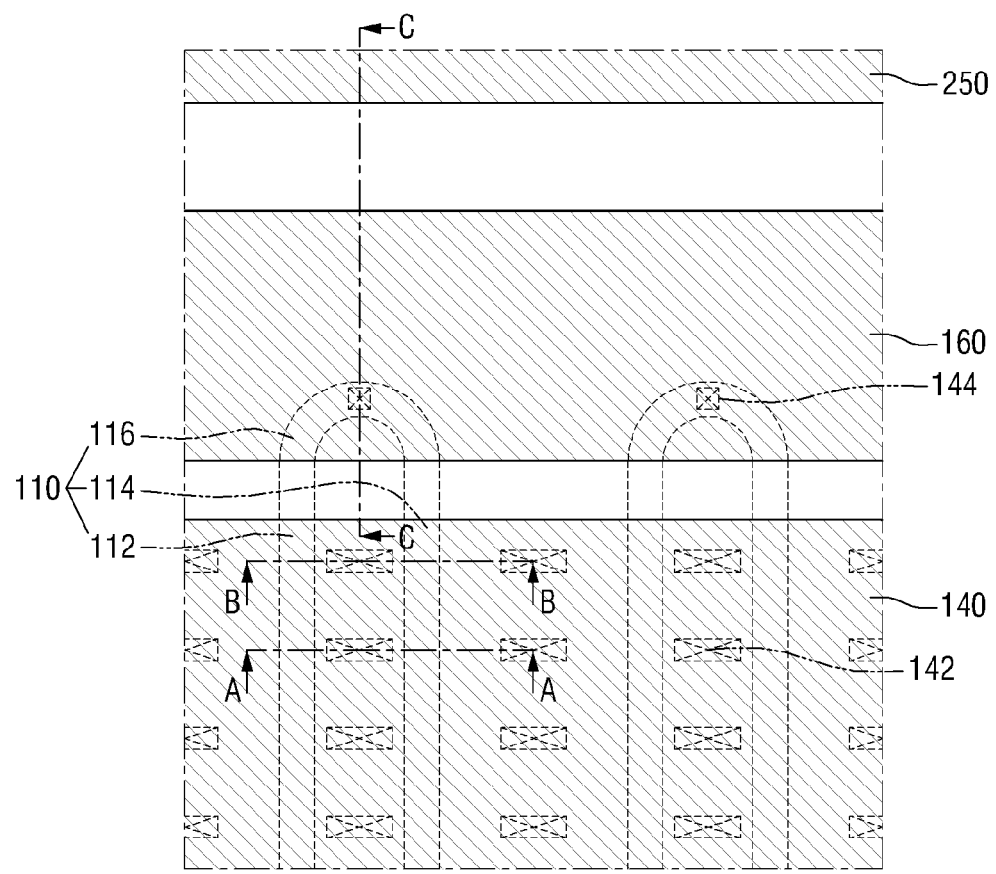
FIG. 8 is a partial plan view of the semiconductor device according to a fourth embodiment of the present inventive concept.

FIG. 8 is a partial plan view of a semiconductor device according to a fourth embodiment of the present inventive concept, illustrating a partially enlarged plan view of a portion X of FIG. 1. FIG. 9 is a cross-sectional view taken along lines A-A, B-B and C-C of FIG. 8.

Figure 9:
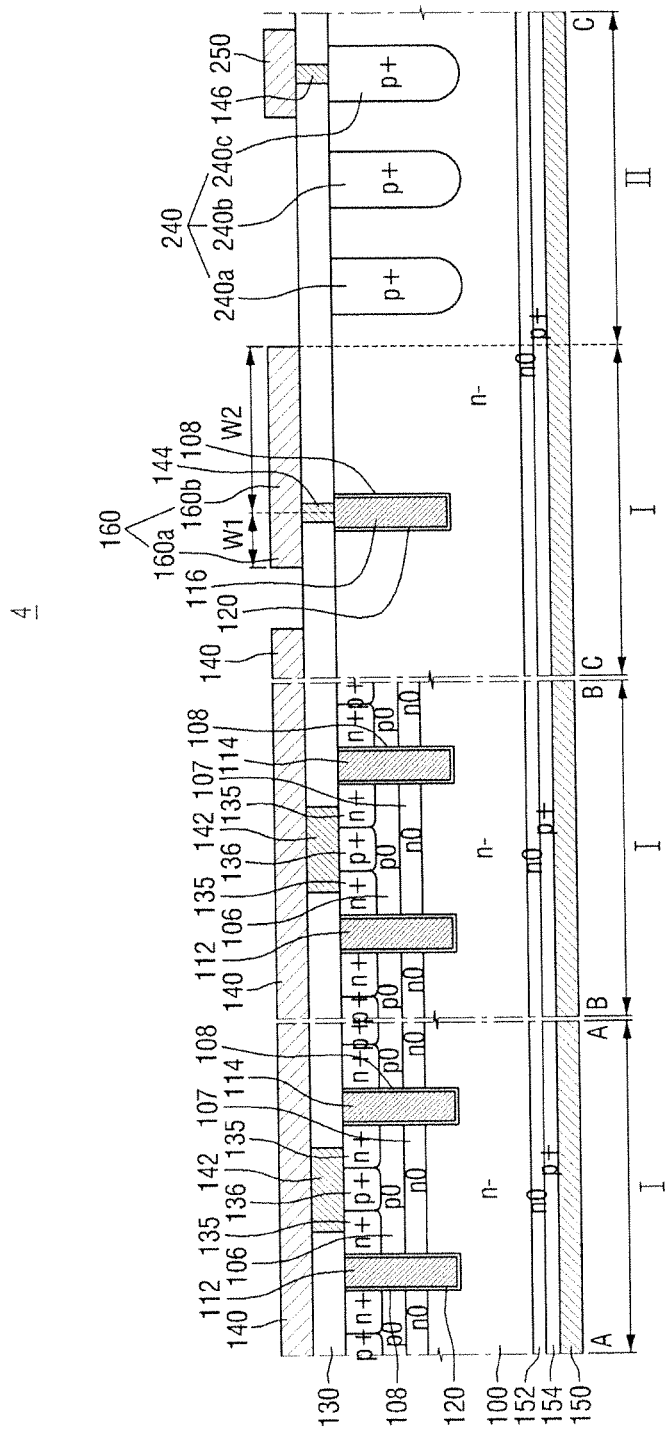
FIG. 9 is a cross-sectional view taken along lines A-A, B-B and C-C of FIG. 8.

Referring to FIGS. 8 and 9, the semiconductor device 4 according to the fourth embodiment of the present inventive concept may not include a floating well 105 and a junction diffusion region 104.

Referring to FIG. 9, a body 106 may be formed around a first trench gate 112 and a second trench gate 114. That is, the body 106 may be formed at both of the first trench gate 112 and the second trench gate 114. In addition, emitters 135 formed in the body 106 may be also formed at both of the first trench gate 112 and the second trench gate 114.

A first contact 142 may be formed between the first trench gate 112 and the second trench gate 114, which are connected to each other by a gate connection part 116, and between the first trench gate 112 and the second trench gate 114, which are connected to another gate connection part 116.

Referring to FIG. 9, the first contact 142 in contact with the emitters 135 may be formed at the same height as a second contact 144 in contact with the gate connection part 116, and the first contact 142 and the second contact 144 may include the same material.

A semiconductor device 5 according to a fifth embodiment of the present inventive concept will now be described with reference to FIGS. 1, 2 and 10.

Figure 10:
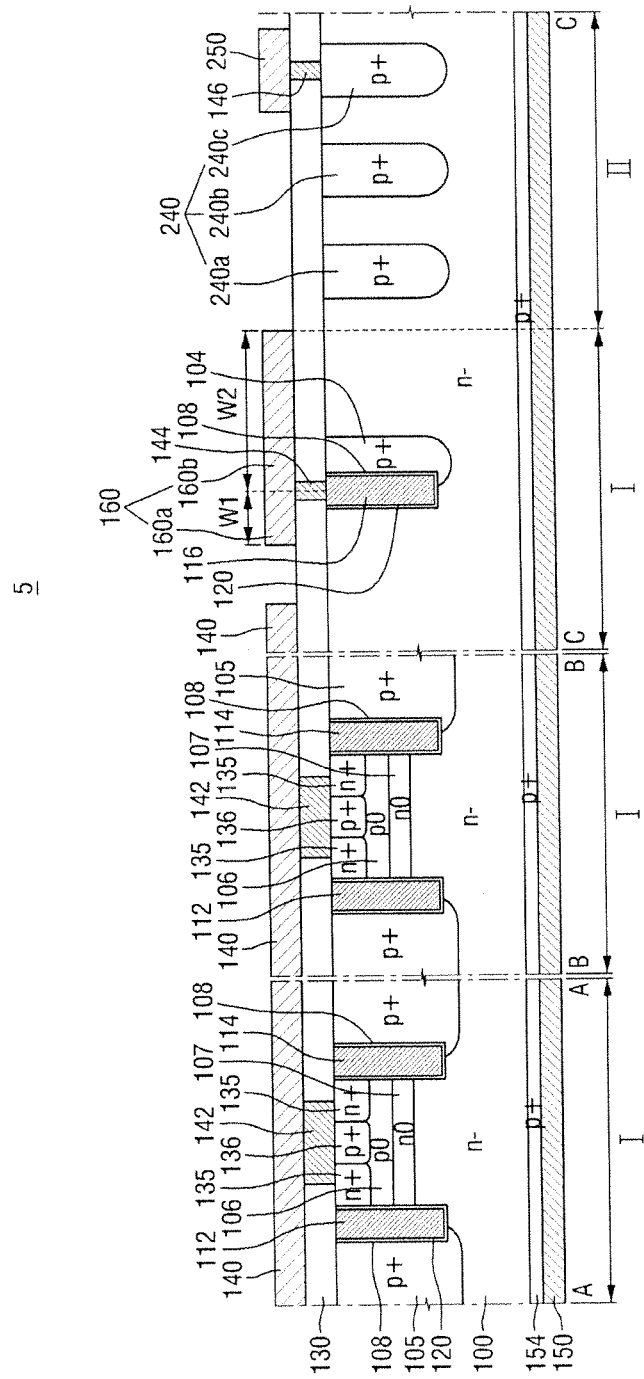
FIG. 10 is a cross-sectional view of a semiconductor device according to a fifth embodiment of the present inventive concept.

FIG. 10 is a cross-sectional view of a semiconductor device according to a fifth embodiment of the present inventive concept, taken along lines A-A, B-B and C-C of FIG. 2.

Referring to FIG. 10, the semiconductor device 5 according to the fifth embodiment of the present inventive concept may not include a buffer layer 152. In a case where a sufficiently high breakdown voltage characteristic can be obtained without the buffer layer 152, the buffer layer 152 may not be formed.

A semiconductor device 6 according to a sixth embodiment of the present inventive concept will now be described with reference to FIGS. 1 and 11.

Figure 11:
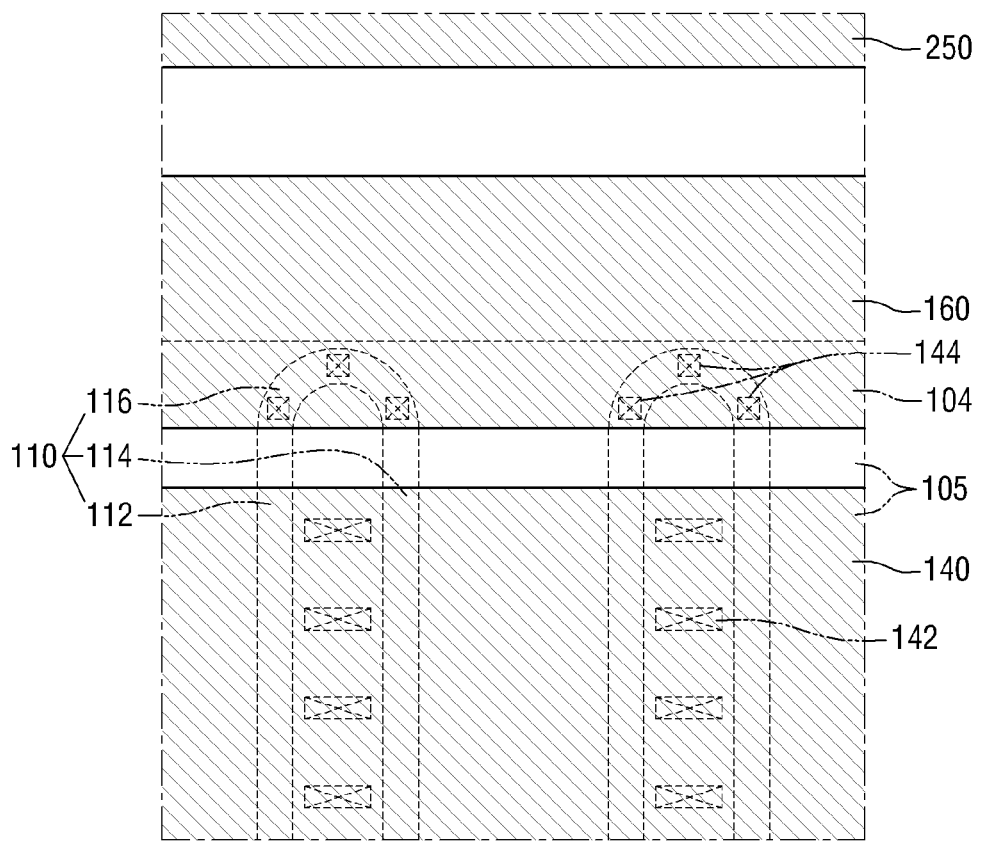
FIG. 11 is a partial plan view of a semiconductor device according to a sixth embodiment of the present inventive concept.

FIG. 11 is a partial plan view of a semiconductor device according to the sixth embodiment of the present inventive concept, illustrating a partially enlarged plan view of a portion X of FIG. 1.

Referring to FIG. 11, in the semiconductor device 6 according to the sixth embodiment of the present inventive concept, a first field plate 160 and gate connection parts 116 may be connected to each other by a plurality of second contacts 144.

The first field plate 160 and the gate connection parts 116 may be connected to each other by the plurality of second contacts 144, thereby more effectively diffusing an electrical field generated while the semiconductor device 6 operates.

A semiconductor device 7 according to a seventh embodiment of the present inventive concept will now be described with reference to FIGS. 1 and 12.

Figure 12:
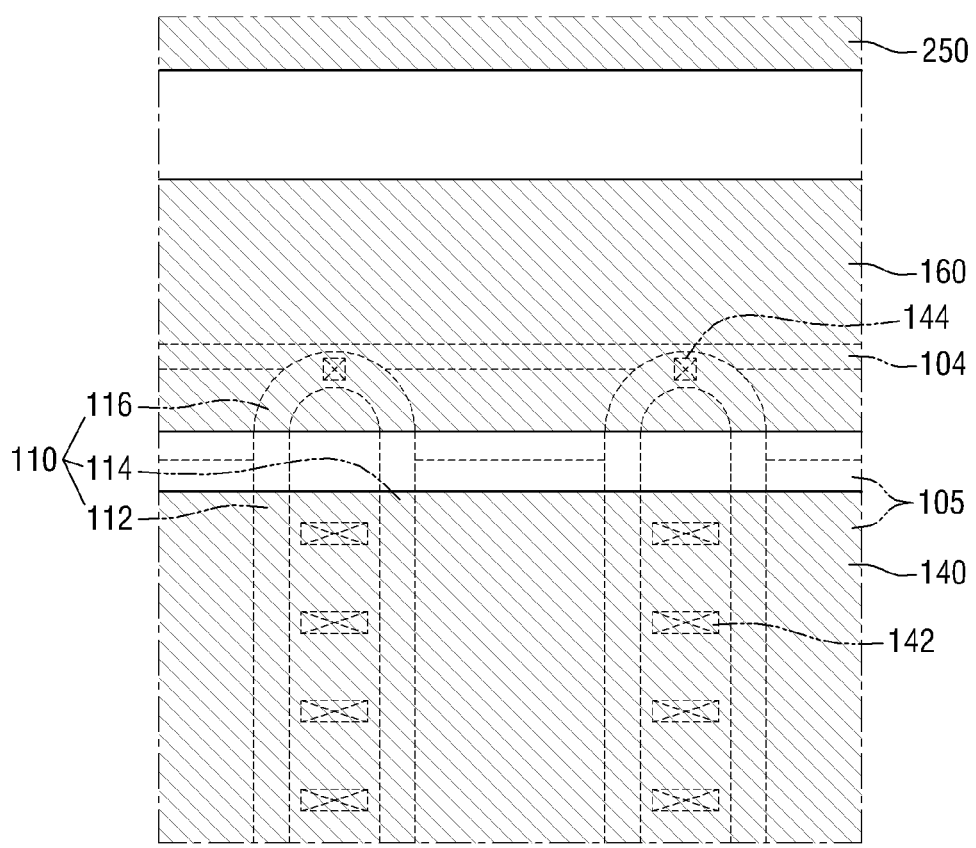
FIG. 12 is a partial plan view of a semiconductor device according to a sixth embodiment of the present inventive concept.

FIG. 12 is a partial plan view of a semiconductor device according to the seventh embodiment of the present inventive concept, illustrating a partially enlarged plan view of a portion X of FIG. 1.

Referring to FIG. 12, in the semiconductor device 7 according to the seventh embodiment of the present inventive concept, a junction diffusion region 104 and a floating well 105 may not be connected to each other but may be separated from each other.

The junction diffusion region 104 and the floating well 105 may be formed by separate mask processes, but the present inventive concept is not limited thereto. In addition, the junction diffusion region 104 and the floating well 105 may be formed in a substrate 100 to different depths.

The junction diffusion region 104 may be formed on one of lateral surfaces of the gate connection parts 116 facing a second field plate 250, thereby improving a breakdown voltage characteristic of the semiconductor device 7.

Figure 13:
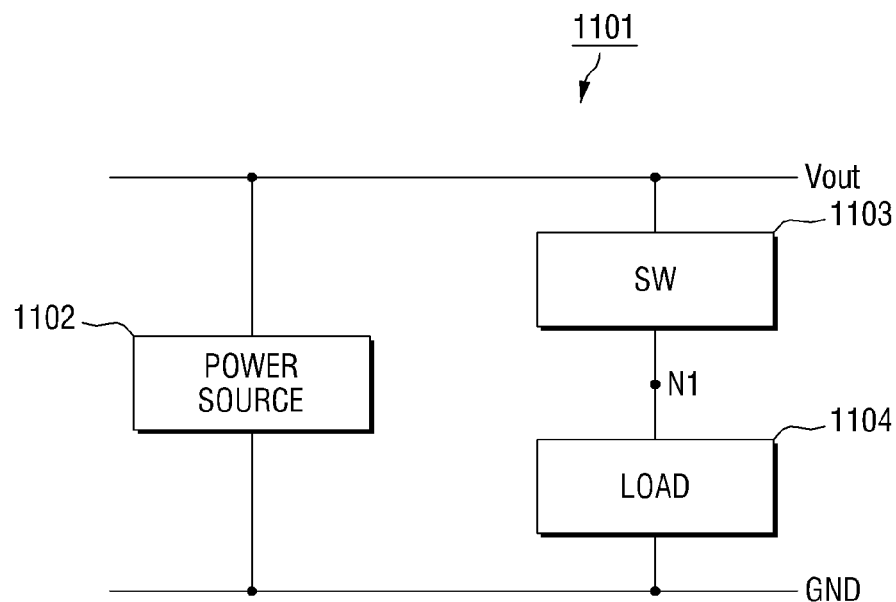
FIG. 13 is a block diagram of a semiconductor system including semiconductor devices according to some embodiments of the present inventive concept.

FIG. 13 is a block diagram of a semiconductor system including semiconductor devices according to some embodiments of the present inventive concept.

Referring to FIG. 13, the semiconductor system 1101 including semiconductor devices according to some embodiments of the present inventive concept may include a power source 1102, a switch 1103, a load 1104, and so on. The switch 1103 may transfer power from the power source 1102 to the load 1104. In particular, the power source 1102 may supply a voltage of, for example, 600 V or higher. In an event of a short circuit (for example, in an event where a ground voltage GND is applied to a node N1), a voltage of 600 V or higher may be instantaneously applied to the switch 1103. The switch 1103 should be able to withstand the high voltage for a predetermined duration of time (e.g., 5 µs or longer).

At least one of the semiconductor devices according to some embodiments of the present inventive concept having been described with reference to FIGS. 1 to 12 may be used as the switch 1103.

In the illustrated embodiment, the semiconductor devices according to some embodiments of the present inventive concept having been described with reference to FIGS. 1 to 12 may be used for power supply devices, but the present inventive concept is not limited thereto.

Figure 14:
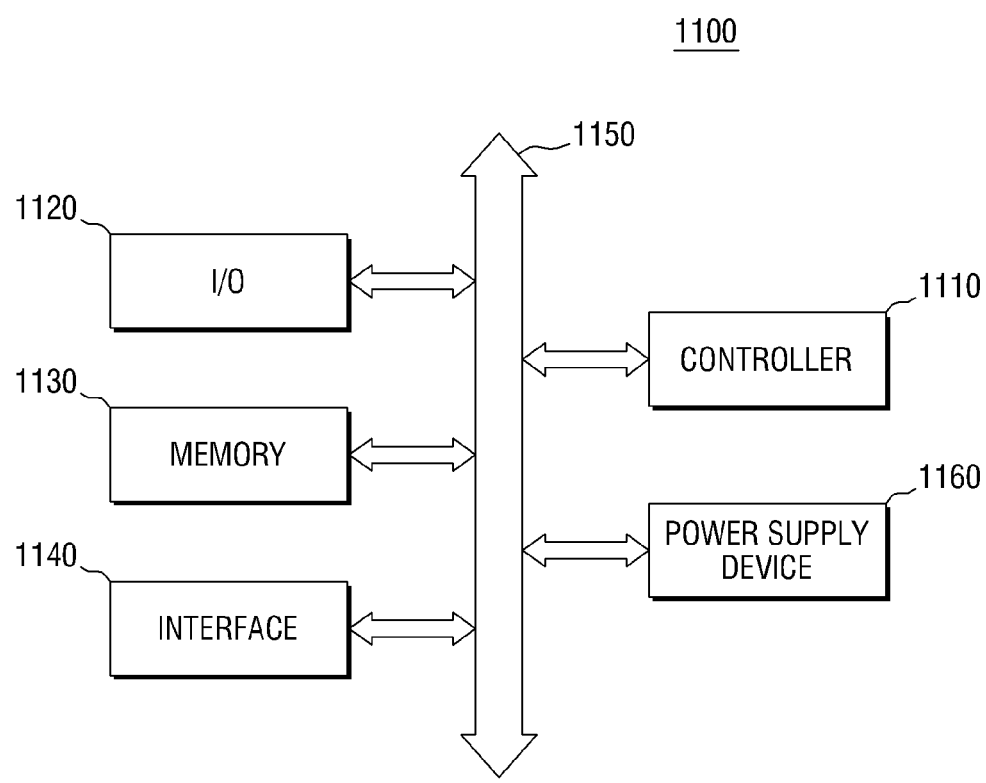
FIG. 14 is a block diagram of an electronic system including semiconductor devices according to some embodiments of the present inventive concept.

FIG. 14 is a block diagram of an electronic system including semiconductor devices according to some embodiments of the present inventive concept.

Referring to FIG. 14, the electronic system 1100 may include a controller 1110, an input/output (I/O) device 1120, a memory 1130, an interface 1140, a power supply 1160 and a bus 1150. The controller 1110, the I/O device 1120, the memory 1130, and/or the interface 1140 may be connected to each other through the bus 1150. The bus 1150 corresponds to a path through which data are transferred.

The controller 1110 may include at least one of a microprocessor, a digital signal processor, a microcontroller, and logic elements capable of functions similar to those of the microprocessor, digital signal processor, and microcontroller. The I/O device 1120 may include a keypad, a keyboard, a display device, and so on. The memory 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed DRAM and/or SRAM as the working memory for improving the operation of the controller 1110. The power supply 1160 may convert externally input power to provide the converted power to the respective components 1110, 1120, 1130 and 1140. One or more of the power supply 1160 may be installed in the electronic system 1100. The semiconductor devices according to some embodiments of the present inventive concept may be provided some components of the power supply 1160.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 15:
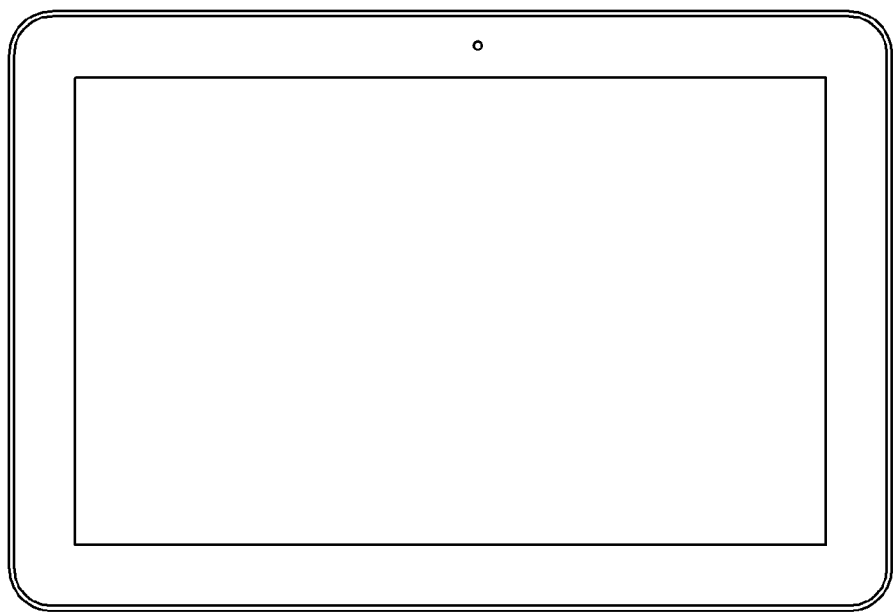
FIGS. 15 and 16 illustrate exemplary electronic systems to which semiconductor devices according to some embodiments of the present inventive concept.
Figure 16:
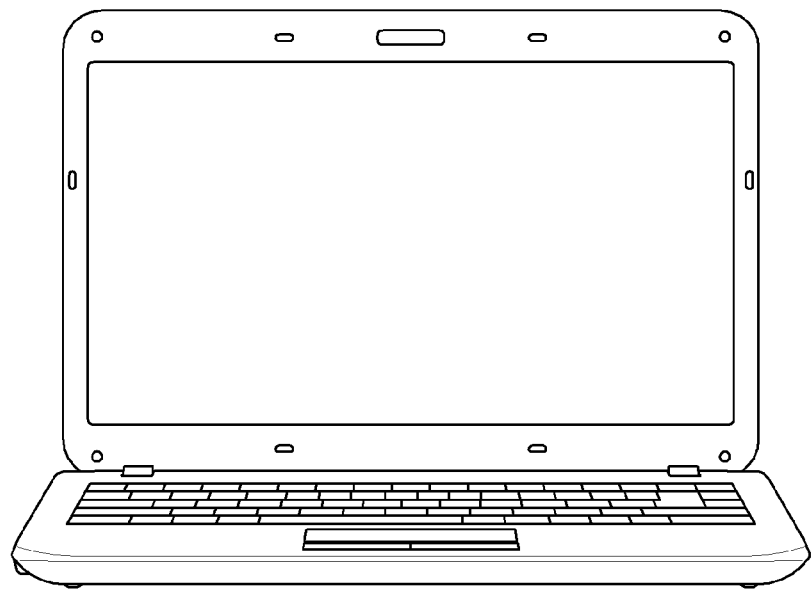

FIGS. 15 and 16 illustrate an exemplary semiconductor system to which semiconductor devices according to some embodiments of the present inventive concept can be employed. FIG. 15 illustrates an example in which a semiconductor device according to an embodiment of the present inventive concept is applied to a tablet PC, and FIG. 16 illustrates an example in which a semiconductor device according to an embodiment of the present inventive concept is applied to a notebook computer. It is obvious to one skilled in the art that the semiconductor devices according to some embodiments of the present inventive concept may also be applied to other IC devices not illustrated herein.

Hereinafter, a method of fabricating the semiconductor device according to the third embodiment of the present inventive concept will be described with reference to FIGS. 1, 3 and 17 to 21.

FIGS. 17 to 21 illustrate intermediate process steps in a method of fabricating the semiconductor device according to the first embodiment of the present inventive concept, taken along lines A-A, B-B and C-C of FIG. 2.

Figure 17:
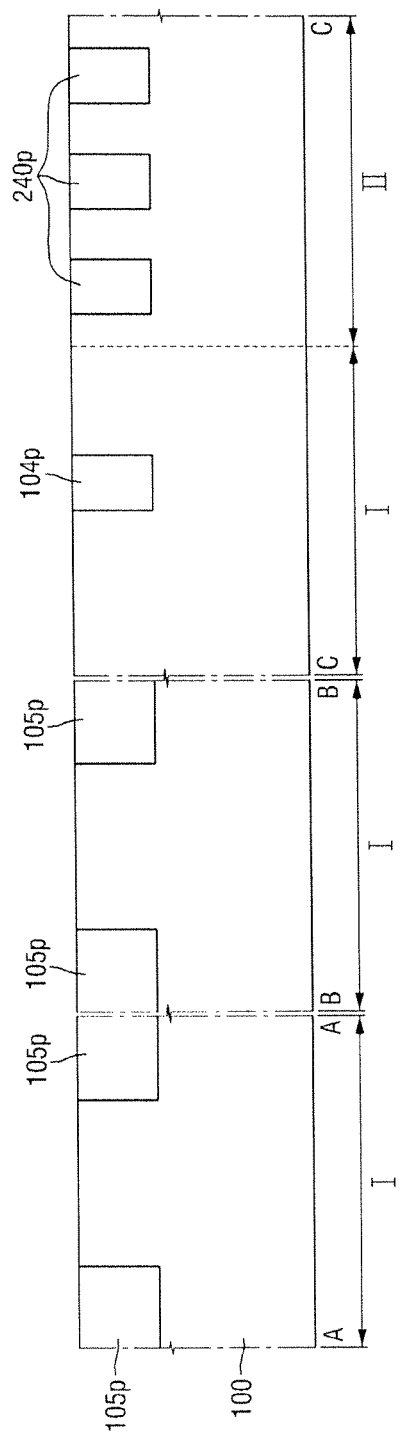
FIGS. 17 to 21 illustrate intermediate process steps in the method of fabricating the semiconductor device according to the first embodiments of the present inventive concept.

Referring to FIG. 17, a first mask pattern may be formed on the substrate 100, and a pre-floating well 105*p* of the second conductivity type (e.g., P type) and a pre-junction diffusion region 104*p* of the second conductivity type may be formed in the first region I of the substrate 100. In addition, a pre-field diffusion junction 240*p* may be formed in the second region II of the substrate 100.

The pre-floating well 105*p* of the second conductivity type may be used to form the floating well (105 of FIG. 3). The pre-junction diffusion region 104*p* of the second conductivity type may be used to form the junction diffusion region (104 of FIG. 3). The pre-field diffusion junction 240*p* may be used to form the field diffusion junction (240 of FIG. 3). The pre-floating well 105*p* of the second conductivity type and the pre-junction diffusion region 104*p* of the second conductivity type may be connected to each other, but the present inventive concept is not limited thereto.

For example, the pre-floating well 105*p*, the pre-junction diffusion region 104*p* and the pre-field diffusion junction 240*p* may be formed by implanting a dopant of the second conductivity type. The dopant of the second conductivity type may include, for example, boron (B), but not limited thereto.

Next, the first mask pattern may be removed.

Figure 18:
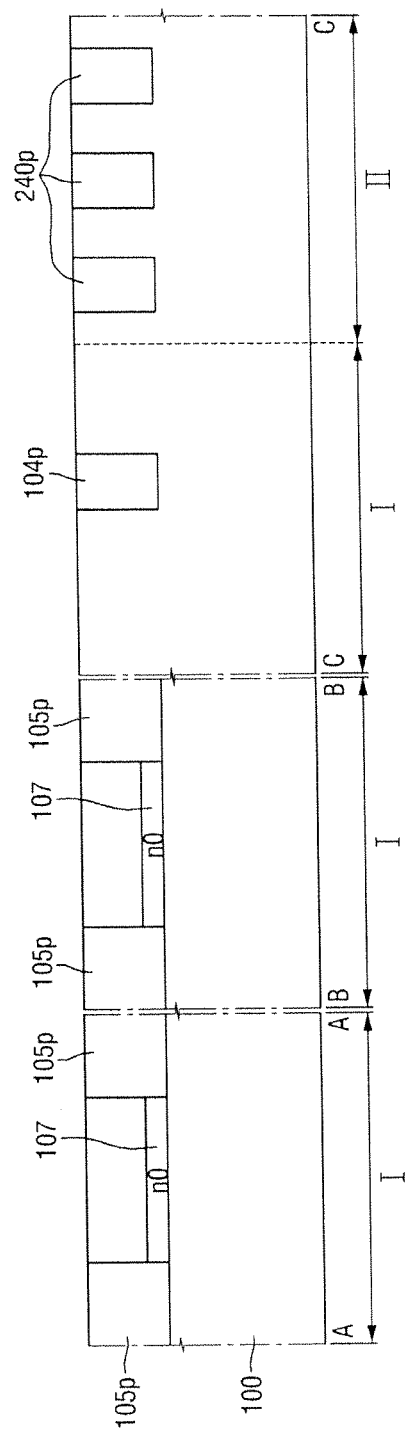

Referring to FIG. 18, a barrier layer 107 of the first conductivity type (e.g., N type) may be formed in the first region I of the substrate 100.

In detail, the barrier layer 107 may be formed by implanting the dopant of the first conductivity type on the entire surface of the first region I of the substrate 100 except for a potential region while covering the potential region with a second mask pattern where a gate connection part 116 is to be formed. The barrier layer 107 may be formed in a considerably small concentration, e.g., smaller than a concentration of the pre-floating well 105*p* of the second conductivity type. Therefore, the barrier layer 107 may not be formed in the pre-floating well 105*p*, like in the embodiment illustrated in FIG. 18. The dopant of the first conductivity type may be phosphorus (P), but the present inventive concept is not limited thereto.

Next, the second mask pattern is removed.

Figure 19:
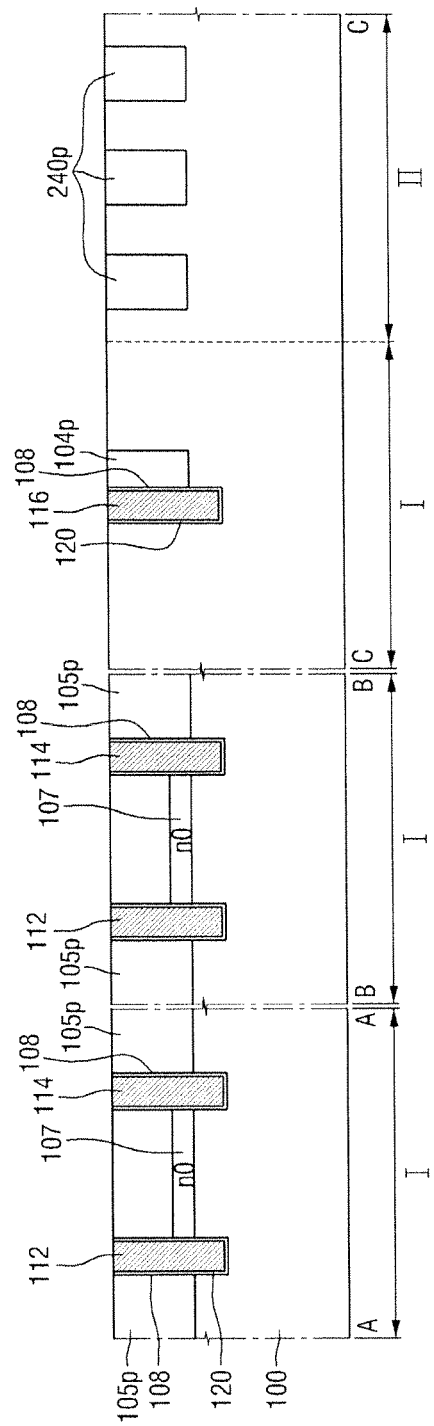

Referring to FIG. 19, a trench gate structure 110 may be formed in the first region I of the substrate 100.

In detail, a trench 108 may be formed in the first region I of the substrate 100. As shown in FIG. 19, a depth of the trench 108 may be greater than depths of the barrier layer 107, the pre-floating well 105*p* and the pre-junction diffusion region 104*p*.

Next, a gate insulation layer 120 may be conformally formed along sidewalls and a bottom surface of the trench 108. The gate insulation layer 120 may include at least one of silicon oxide, silicon nitride, silicon oxynitride and a high-k material.

Next, the trench 108 may be filled on the gate insulation layer 120, thereby completing the trench gate structure 110. For example, the trench 108 may be filled with a conductive material to be sufficiently formed on the substrate 100, followed by performing Chemical Mechanical Planarization (CMP) to expose a top surface of the substrate 100, thereby completing the trench gate structure 110.

As described above with reference to FIGS. 2 and 3, the trench gate structure 110 may include the first trench gate 112 and the second trench gate 114 adjacent to each other in a lengthwise direction and a gate connection part 116 connecting termination parts of the first trench gate 112 and the second trench gate 114.

Figure 20:
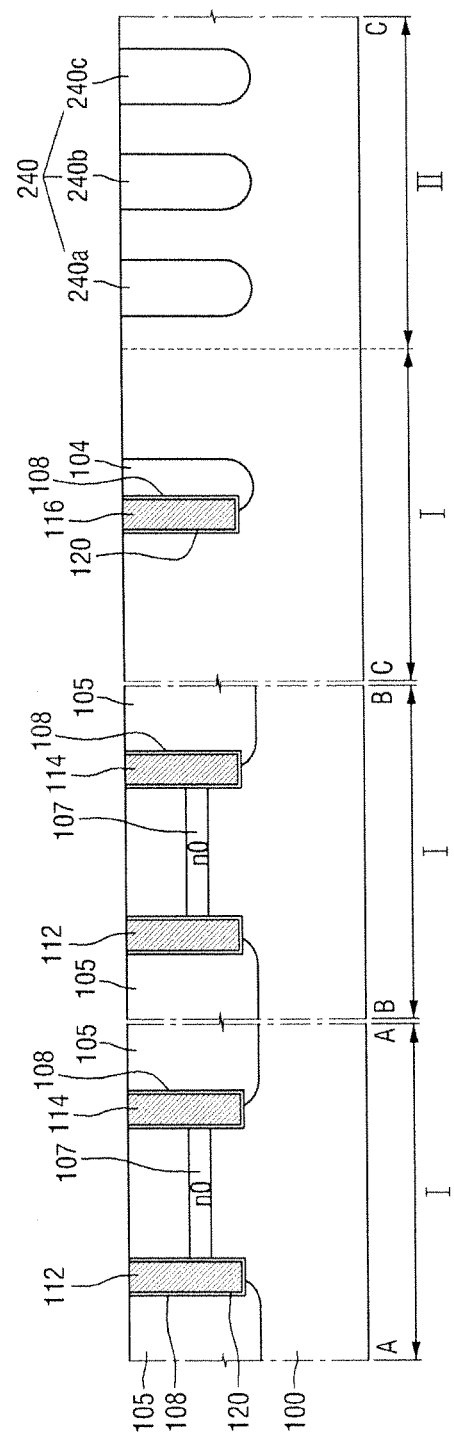

Referring to FIG. 20, the pre-floating well 105*p* of the second conductivity type and the pre-junction diffusion region 104*p* may be diffused through a drive-in process, thereby forming the floating well 105 of the second conductivity type and the junction diffusion region 104. As a result of the drive-in process for forming the floating well 105, the pre-field diffusion junction 240*p* may be diffused, thereby forming the field diffusion junction 240 of the second conductivity type. The drive-in process may include, for example, thermal tube annealing, rapid thermal annealing (RTA) or laser annealing.

In detail, the drive-in process may diffuse both of the pre-floating well 105*p* of the second conductivity type and the barrier layer 107 of the first conductivity type. However, phosphorus (P) is not readily diffused, compared to boron (B). That is, a large amount of the barrier layer 107 may not be diffused while the floating well 105 of the second conductivity type is formed.

Figure 21:
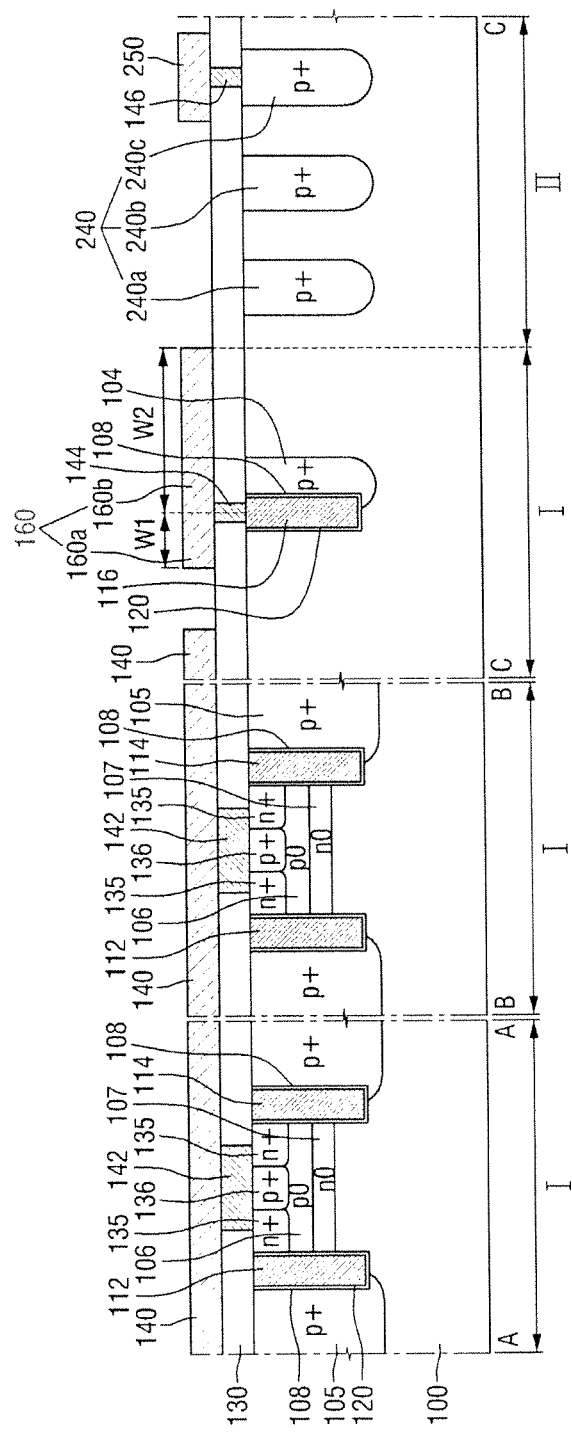

Referring to FIG. 21, a body 106 may be formed between the first trench gate 112 and the second trench gate 114. The body 106 may not overlap with the floating well 105.

Next, emitters 135 of the first conductivity type may be formed in the body 106. In addition, a doping region 136 of the second conductivity type may be formed between the emitters 135 formed in the body 106.

Next, an interlayer dielectric layer 130 may be formed on one surface of the substrate 100, so that the interlayer dielectric layer 130 covers the first trench gate 112, the second trench gate 114, the gate connection part 116 and the field diffusion junction 240.

Next, first to third contacts 142, 144 and 146 passing through the interlayer dielectric layer 130 may be formed. The first contact 142 may make contact with the emitters 135 and the doping region 136 of the second conductivity type, the second contact 144 may make contact with the gate connection part 116, and the third contact 146 may make contact with the field diffusion junction 240.

Next, an emitter electrode 140 connected to the first contact 142, a first field plate 160 connected to the second contact 144, and a second field plate 250 connected to the third contact 146, may be formed on the interlayer dielectric layer 130.

The first field plate 160 formed on the second contact 144 may have a second part 160b extending in a first direction toward the field diffusion junction 240 with respect to the second contact 144, and a first part 160a extending in a direction opposite of the first direction toward the field diffusion junction 240 with respect to the second contact 144.

The first part 160a of the first field plate 160 may be a part extending toward the emitter electrode 140 with respect to the second contact 144. A first width W1 of the first part 160a of the first field plate 160 may be smaller than a second width W2 of the second part 160b of the first field plate 160.

Each of the emitter electrode 140, the first field plate 160 and the second field plate 250 may be shaped of a plate. The emitter electrode 140, the first field plate 160, the second field plate 250 and the first to third contacts 142, 144 and 146 may include, for example, at least one of aluminum, copper, tungsten and titanium, but the present inventive concept is not limited thereto.

Next, referring to FIG. 3, a thickness of the substrate 100 may be reduced by a thinning process.

Next, a buffer layer 152 may be formed on the other surface of the substrate 100, on which the interlayer dielectric layer 130 is not formed.

Next, a collector 154 may be formed on the other surface of the substrate 100 so as to make contact with the buffer layer 152. The collector 154 may have the second conductivity type.

Next, a collector electrode 150 may be formed on the other surface of the substrate 100 so as to make contact with the collector 154. The collector electrode 150 may include, for example, at least one of aluminum, copper, tungsten, titanium, nickel, nickel vanadium, silver and gold, but the present inventive concept is not limited thereto.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device, comprising:
   a substrate of a first conductivity type, the substrate having a first region and a second region defined therein;
   first and second trench gates disposed in the first region, positioned to be adjacent to each other, and extending in a lengthwise direction;
   a body disposed between the first trench gate and the second trench gate and having a second conductivity type different from the first conductivity type;
   emitters of the first conductivity type, disposed in the body;
   a floating well of the second conductivity type, defined at one side of each of the first trench gate and the second trench gate while not overlapping with the body;
   an emitter electrode disposed on the substrate to be connected to the emitters;
   a gate connection part disposed in the first region and connecting termination parts of the first and second trench gates;
   a field diffusion junction disposed in the second region;
   a first contact in contact with the gate connection part in the first region; and
   a first field plate having a first part and a second part and connected to the first contact on the first contact, the first part extending toward the emitter electrode with respect to the first contact along the lengthwise direction and having a first width, and the second part extending toward the field diffusion junction with respect to the first contact away from the lengthwise direction and having a second width that is greater than the first width.

2. The semiconductor device of claim 1, further comprising an interlayer dielectric layer disposed on the substrate and having a flat surface while covering the first trench gate, the second trench gate and the gate connection part,
   wherein the first contact passes through the interlayer dielectric layer, and the emitter electrode and the first field plate are disposed on the interlayer dielectric layer.

3. The semiconductor device of claim 1, wherein the field diffusion junction is free of portions overlapping with the first field plate.

4. The semiconductor device of claim 1, further comprising a second field plate spaced apart from the first field plate and connected to the field diffusion junction.

5. The semiconductor device of claim 1, wherein the gate connection part is directly surrounded by the substrate.

6. The semiconductor device of claim 1, further comprising a junction diffusion region of the second conductivity type, disposed on a lateral surface of the gate connection part disposed toward the field diffusion junction,
   wherein the substrate includes a region of the first conductivity type overlapping with the first part of the first field plate in a direction perpendicular to a surface of the substrate and extending from the surface of the substrate along the direction perpendicular to the surface of the substrate.

7. The semiconductor device of claim 1, further comprising a second contact connecting the emitter electrode and the emitters, wherein the first contact and the second contact are disposed at the same height and include the same material as each other.

8. The semiconductor device of claim 7, wherein:

the first trench gate includes a first part and a second part that is positioned closer to the gate connection part than the first part, the second trench gate includes a first part and a second part corresponding to the first and second parts of the first trench gate, respectively, and the emitters are disposed between the first part of the first trench gate and the first part of the second trench gate while not being disposed between the second part of the first trench gate and the second part of the second trench gate.

* * * * *